United States Patent
Nsame et al.

(10) Patent No.: US 7,966,589 B2
(45) Date of Patent: *Jun. 21, 2011

(54) STRUCTURE FOR DYNAMIC LATCH STATE SAVING DEVICE AND PROTOCOL

(75) Inventors: Pascal A. Nsame, Colchester, VT (US); Anthony J. Perri, Jericho, VT (US); Lansing D. Pickup, Williston, VT (US); Sebastian T. Ventrone, South Burlington, VT (US); Matthew R. Welland, Tempe, AZ (US)

(73) Assignee: International Business Machines Corporation, Armonk, NY (US)

( * ) Notice: Subject to any disclaimer, the term of this patent is extended or adjusted under 35 U.S.C. 154(b) by 538 days.

This patent is subject to a terminal disclaimer.

(21) Appl. No.: 12/099,423

(22) Filed: Apr. 8, 2008

(65) Prior Publication Data

US 2008/0186069 A1 Aug. 7, 2008

Related U.S. Application Data

(63) Continuation-in-part of application No. 11/530,981, filed on Sep. 12, 2006, now Pat. No. 7,495,492.

(51) Int. Cl.
*G06F 17/50* (2006.01)
(52) U.S. Cl. ........ 716/100; 716/111; 716/119; 716/126; 716/127; 716/133; 327/199; 327/202; 327/203; 327/204; 365/154
(58) Field of Classification Search ............... 716/1, 11, 716/12, 16, 100, 111, 119, 126, 127, 133; 327/199, 202–204; 365/154
See application file for complete search history.

(56) References Cited

U.S. PATENT DOCUMENTS 5,065,362 A 11/1991 Herdt et al.
(Continued)

FOREIGN PATENT DOCUMENTS

JP 58117055 A 7/1983

OTHER PUBLICATIONS

"Tutorial—Cadence Design Environment", by Antonio J. Lopez Martin, Klipsch School of Electrical and Computer Engineering, New Mexico State University, http://www.ece.nmsu.edu/vlsi/cadence/CADENCE%20Manual.pdf, @ Oct. 2002. http://www.ece.nmsu.edu/vlsi/cadence/Cadence%20Manual.pdf, @ Oct. 2002.*

(Continued)

*Primary Examiner* — Paul Dinh
*Assistant Examiner* — Nha T Nguyen
(74) *Attorney, Agent, or Firm* — Gibb I.P. Law Firm, LLC; Michael J. LeStrange, Esq.

(57) ABSTRACT

The invention comprises a design structure for a dynamic voltage state-saving latch electrical circuit comprising a charge device adapted as a storage element, an integrated recovery mechanism, a supply voltage rail connected to the charge device, a hold signal allocated to the integrated recovery mechanism, a data signal input allocated to said charge device, a data signal output distributed from the charge device, and a clock signal allotted to the charge device, wherein said integrated recovery mechanism maintains a state of the charge device independent of the charge device.

13 Claims, 5 Drawing Sheets

U.S. PATENT DOCUMENTS

| | | | |
|---|---|---|---|
| 5,361,224 | A | 11/1994 | Takasu |
| 5,461,649 | A | 10/1995 | Bailey et al. |
| 5,646,566 | A | 7/1997 | Ross, Jr. et al. |
| 5,712,826 | A | 1/1998 | Wong et al. |
| 6,493,257 | B1 | 12/2002 | Coughlin, Jr. et al. |
| 6,667,645 | B1 | 12/2003 | Fletcher et al. |
| 6,762,638 | B2 | 7/2004 | Correale, Jr. et al. |
| 6,927,614 | B2 | 8/2005 | Oakland et al. |
| 2001/0038304 | A1 | 11/2001 | Waldie et al. |
| 2004/0068711 | A1* | 4/2004 | Gupta et al. ............. 716/18 |
| 2005/0088213 | A1* | 4/2005 | Oakland et al. .......... 327/199 |

OTHER PUBLICATIONS

Nsame et al., U.S. Appl. No. 11/530,981, Office Action Communication, Aug. 6, 2008, 5 pages.

* cited by examiner

STRUCTURE FOR DYNAMIC LATCH STATE SAVING DEVICE AND PROTOCOL

CROSS-REFERENCE TO RELATED APPLICATIONS

This application is a Continuation-In-Part of U.S. application Ser. No. 11/530,981 filed Sep. 12, 2006, the complete disclosure of which, in its entirety, is herein incorporated by reference.

BACKGROUND

1. Field of the Invention

The embodiments of the invention generally relate to a design structure for a state saving circuit, and, more particularly, to a design structure for a high performance state saving latch.

2. Description of the Related Art

With the increasing popularity of portable electronic devices, such as laptops, cell phones and personal digital assistants (PDAs), there is a growing need for systems that can reduce power consumption in order to extend energy storage times of the device's power supply (e.g., battery). Namely, applications that utilize CMOS integrated circuits (IC's) require circuits that utilize a minimal amount of power and have the capability to be powered down when not in use.

The term "dynamic latch," typically refers to an architecture of latch used for high performance designs where the latch node is pre-charged. Instead, the term "state-saving latch" is typically used to describe a power saving latch where at least part of the latch may be powered down. However, the state saving latches often have a multiple latch, e.g., a master and a slave latch, flip-flop, etc., configuration where only one latch is powered down. This still leaves one full latch powered up.

To save states, static latches with extra devices that are isolated and connected to an extra voltage rail are used to save the state during the period that a voltage island is disconnected. This overhead to the voltage islands increase power routing complexity, i.e., latch overhead, and generally reduces the advantage of using state saving latches and reduces the ability to effectively power down voltage islands.

U.S. Pat. No. 6,667,645 discloses a circuit comprising a dynamic latch controlled by a pulsed clock signal. U.S. Pat. No. 6,927,614 discloses a state saving circuit powered by an uninterruptible power supply.

SUMMARY

The invention is directed to a design structure for a dynamic voltage state-saving latch electrical circuit comprising a charge device adapted as a storage element, an integrated recovery mechanism, a supply voltage rail connected to the charge device, a hold signal allocated to the integrated recovery mechanism, a data signal input allocated to the charge device, a data signal output distributed from the charge device, and a clock signal allotted to the charge device, wherein the integrated recovery mechanism maintains a state of the charge device independent of the charge device.

In view of the foregoing, an embodiment of the invention provides a circuitry that can save the state of a latch before power-down, and restore the state of the latch after power-up without the need for additional voltage rails to maintain the state of the charge device (i.e., storage element).

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1A:
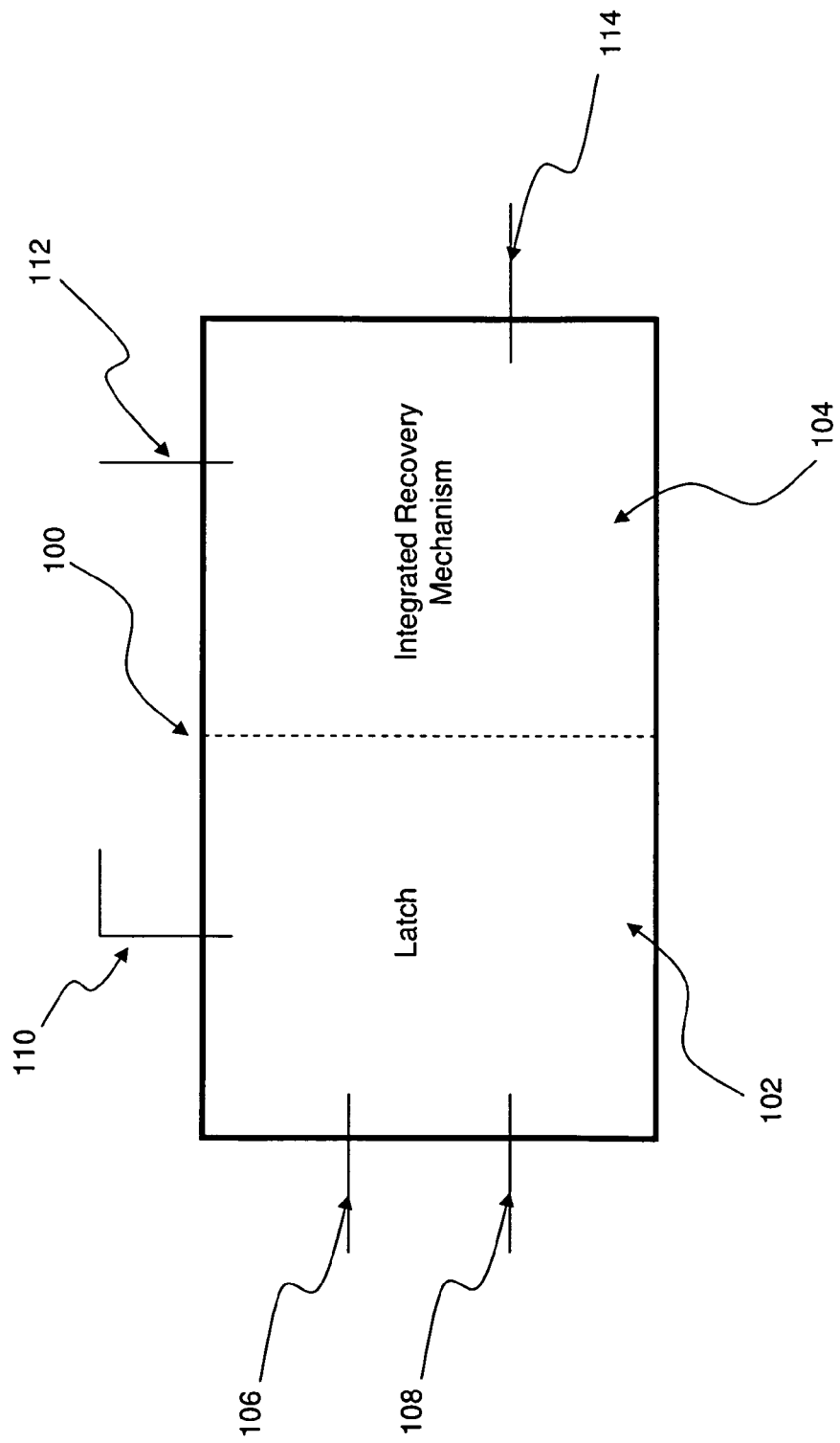
FIG. 1A and FIG. 1B illustrate a schematic diagram of a dynamic voltage state saving latch of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a circuitry that can save the state of a latch before power-down, and restore the state of the latch after power-up without the need for voltage rails to maintain the state of the charge device (e.g., storage element, capacitor). The embodiments of the invention achieve this by providing an integrated recovery mechanism to the storage element (e.g., charge device, capacitor) to maintain a state of the storage element during power down cycles. The invention comprises a circuit and architecture protocol to include dynamic latch structures into the voltage islands, and methods and procedures to safely maintain the voltage value during shutdown, and the return to full power on state.

Figure 1B:
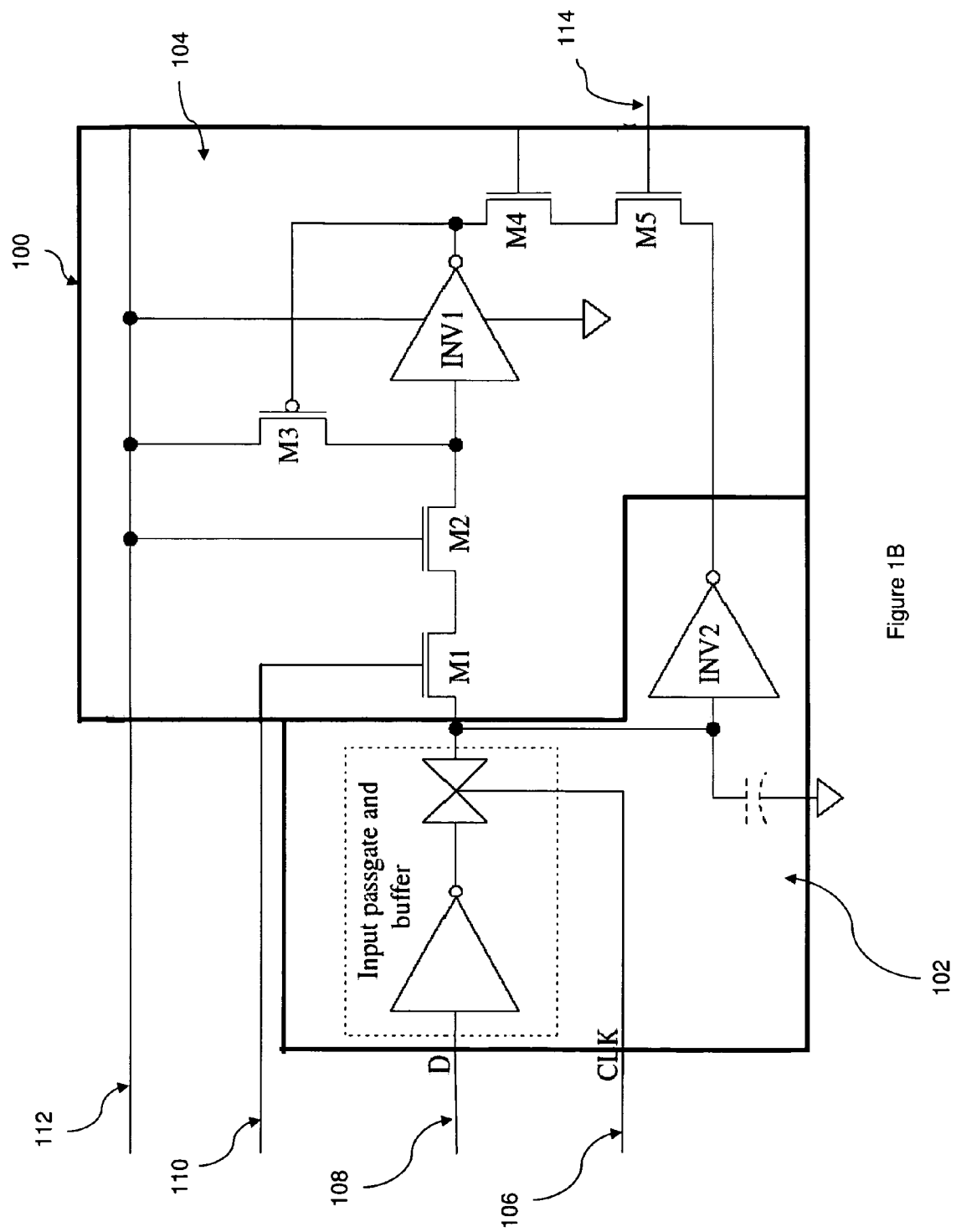
Figure 2:
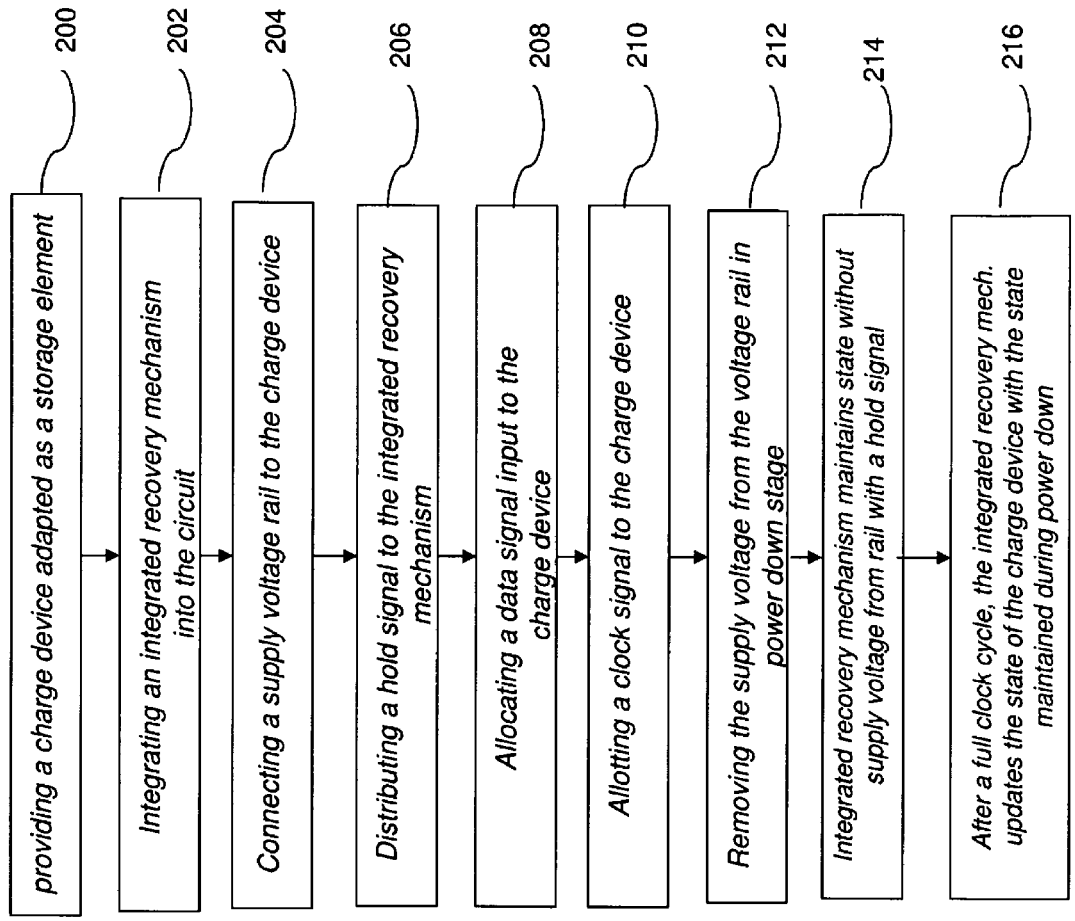
FIG. 2 is a flow diagram illustrating a preferred method of an embodiment of the invention.
Figure 3:
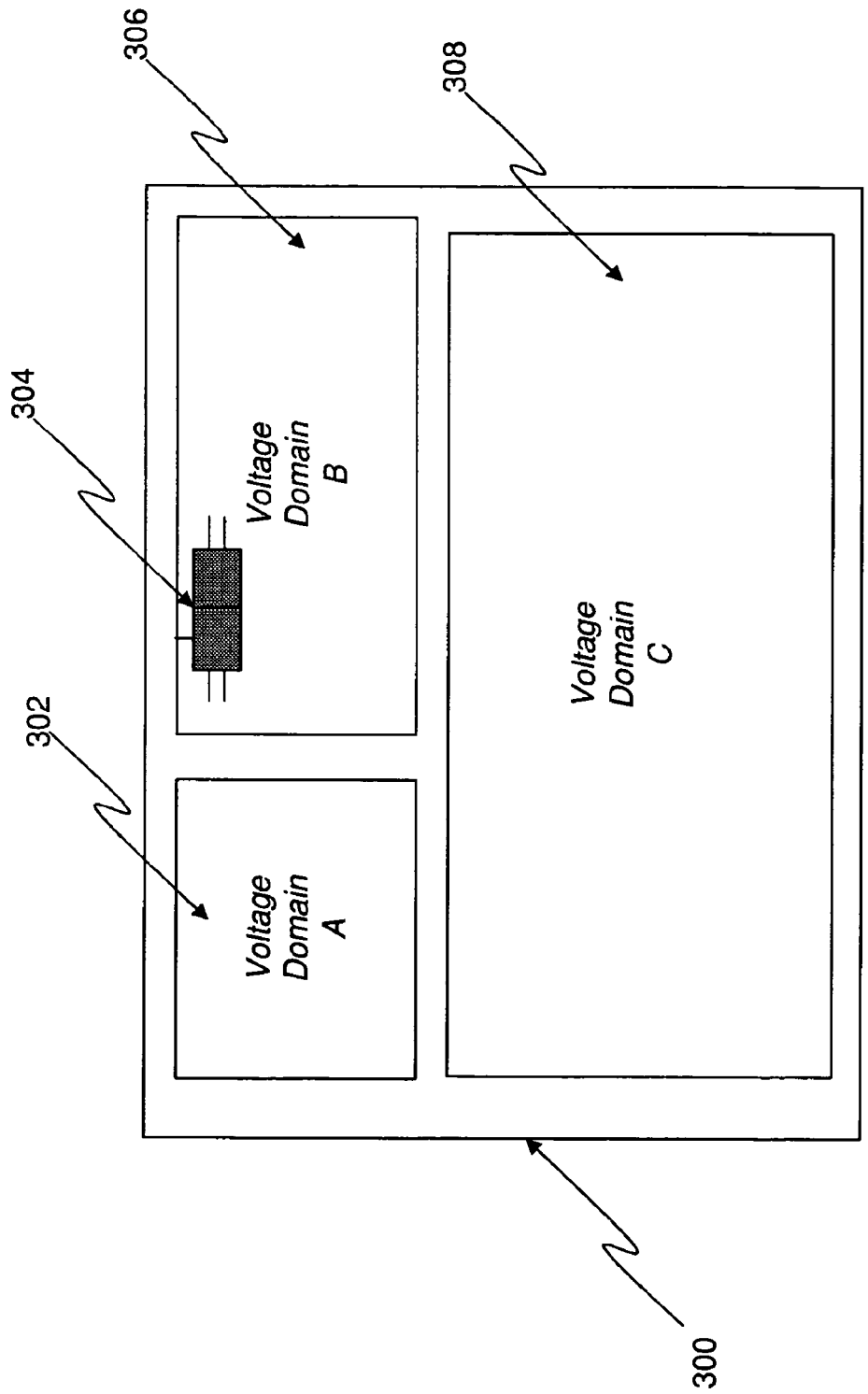
FIG. 3 illustrates a schematic of the dynamic voltage state saving latch of the invention on a silicon die having multiple voltage domains.

Referring now to the drawings, and more particularly to FIGS. 1 through 3, where similar reference characters denote corresponding features consistently throughout the figures, there are shown preferred embodiments of the invention.

FIGS. 1A and 1B illustrates a dynamic state saving latch (100). The state saving latch (100) of the invention comprises a charge device adapted as a storage element (102). The charge device may be a capacitor which stores a state (i.e., charge). The latch also comprises built into or integrated into the circuitry of the latch an integrated recovery mechanism (104). The integrated recovery mechanism functions to hold the state of the charge device when the latch and the surrounding logic are in a powered off state, e.g., powered down or inactive. The integrated recovery mechanism of the invention allows for maintaining the state of the latch without the need for an uninterrupted voltage supply to maintain the state. The integrated recovery mechanism maintains the state of the charge device independent of the charge device. The latch also comprises a hold signal (112) which is distributed to the integrated recovery mechanism. The latch also comprises a data signal input (e.g., D) (108) allocated to the charge device and a data signal output (e.g., Q) (114) distributed from the charge device. The latch also comprises a clock signal (106) allotted to the charge device.

In another embodiment of the invention when the supply voltage rail (110) is active, e.g., powered on or powered up, the clock signal input maintains the state of the charge device. However, when the supply voltage rail is inactive, the integrated recovery mechanism maintains the state of the charge device independent of the state of the charge device. Thus, when powered, down it is the integrated recovery mechanism, not the charge device, that maintains the state/charge. When the voltage supply rail is powered up again, after at least one full clock signal cycle, the state held in the integrated recovery mechanism is transferred to the charge device and can then be processed as an output. In yet another embodiment, when the supply voltage rail is inactive and in a powered down stage, the hold signal is drawn from a part of an integrated circuit or chip that is active or powered up.

FIG. 2 illustrates a flow diagram according to an embodiment of the invention. FIG. 2 illustrates a method for decreasing voltage leakage in dynamic state saving latches comprising periodically supplying a supply voltage and supplying a hold signal to the integrated recovery mechanism of the latch wherein when the supply voltage is active, a clock signal input maintains the state of the charge device of the latch and when the supply voltage is inactive a hold signal supplied to the integrated recovery mechanism maintains the state of the charge device. The method for decreasing voltage leakage in a dynamic voltage state saving latch electrical circuit comprises: providing a charge device adapted as a storage element (200); integrating an integrated recovery mechanism (202); connecting a supply voltage rail to the charge device (204); distributing a hold signal to the integrated recovery mechanism (206); allocating a data signal input to the charge device (208); allotting a clock signal to the charge device (210); and distributing a data signal output from the charge device. The integrated recovery mechanism of the method maintains a state of the charge device independent of the charge device. The integrated recovery mechanism holds the charge of the device using a capacitor rather than a full latch with separate voltage rail to maintain the state. The signal wire of the integrated recovery mechanism supplies enough current, less than a voltage rail, to maintain the state of the circuit. The state of the latch is maintained without the need to keep a voltage rail active.

The method also comprises providing a supply voltage (e.g., Vdd) to the supply voltage rail so that the clock signal input maintains the state of the charge device. After removing the supply voltage from the charge device in a powered down stage (212), the state of the charge device is maintained by the integrated recovery mechanism with out the need of a supply voltage from the supply voltage rail (214). Power down, e.g., shut down mode or an inactive voltage rail, is as simple as stopping the global clock signal to the latch, and then turning on the hold signal, and then turning off the supply voltage. In other embodiments of the invention, the hold signal is constantly maintained and need not be turned on. As long as the hold signal is active, the dynamic latch is able to maintain its state.

When powering up the latch, the supply voltage rail is reactivated to provide voltage to the circuit. After a full clock signal cycle, the integrated recovery mechanism, which has maintained the state of the charge device during the power down stage, updates the state of charge device (216). More particularly, upon powering up from a powered down state, a strict timing sequence must occur that keeps the clock signal off until the supply voltage reaches its full stable state. For this reason, a full clock signal cycle is required, after the supply voltage is resumed, before the state of the storage element, e.g. charge device or capacitor, is reestablished from the state saved by the integrated recovery mechanism. As such the state of the charge device is maintained even when all surrounding logic is powered down. In yet another embodiment of the invention, the hold signal is provided externally from voltage domains or voltage islands that are active when the voltage domain of the latch is inactive (i.e., powered down) or the hold signal is provide externally from the chip which comprises the latch, e.g., from a pad wire.

FIG. 3 is a schematic illustrating a silicon die (300) with three voltage islands: voltage domain A (302), voltage domain B (306) and voltage domain C (308). Voltage domain B, by way of illustration, comprises a voltage saving state saving latch of the invention, as more particularly described above. Thus, in the method of the invention, when voltage domain B is powered down, the integrated recover mechanism maintains the state of the latch until such time as the voltage domain is powered up again.

Figure 4:
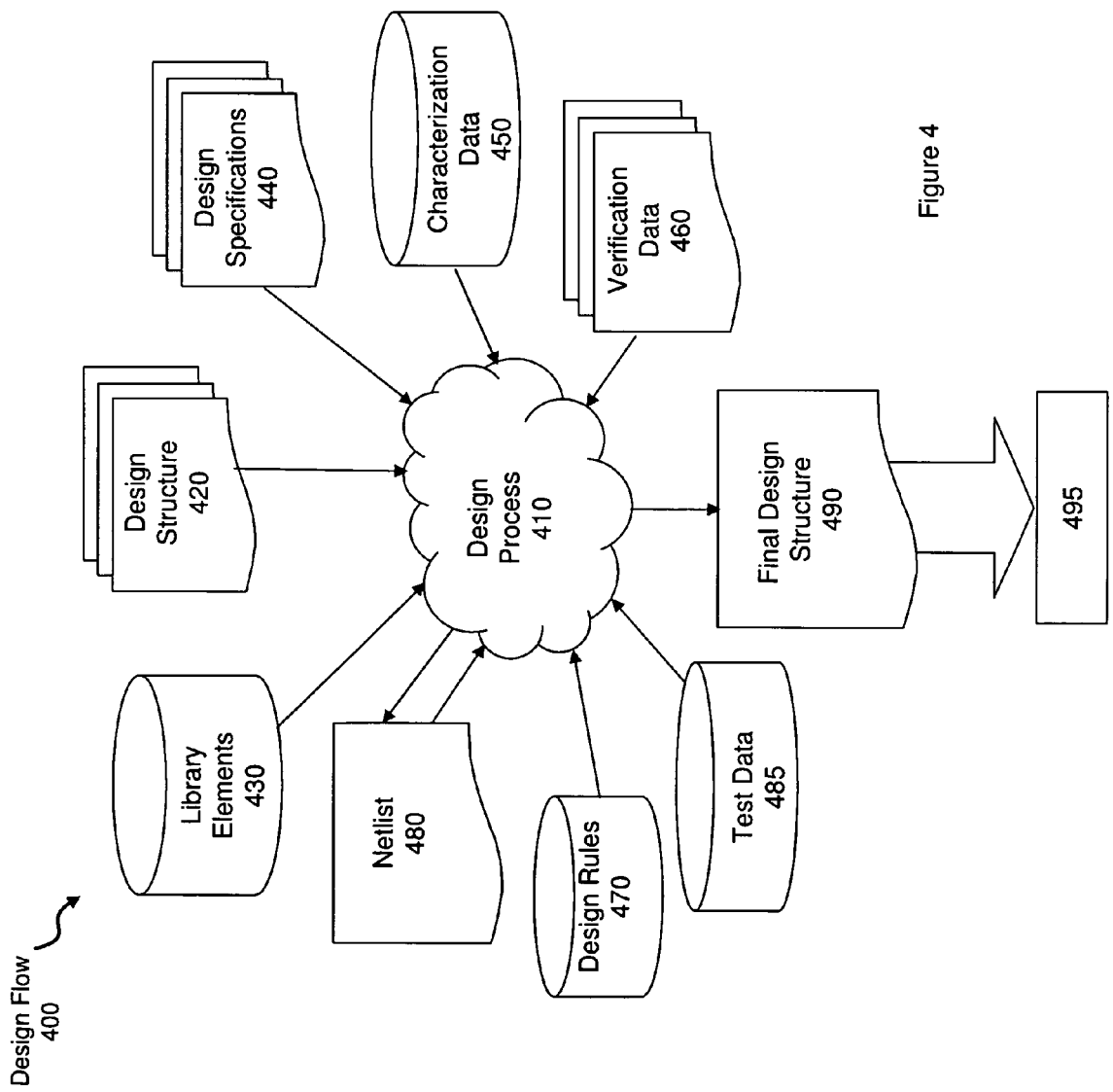
FIG. 4 is a flow diagram of a design process used in semiconductor design, manufacture, and/or test.

FIG. 4 shows a block diagram of an exemplary design flow 400 used for example, in semiconductor design, manufacturing, and/or test. Design flow 400 may vary depending on the type of IC being designed. For example, a design flow 400 for building an application specific IC (ASIC) may differ from a design flow 400 for designing a standard component or from a design from 400 for instantiating the design into a programmable array, for example a programmable gate array (PGA) or a field programmable gate array (FPGA) offered by Altera® Inc. or Xilinx® Inc. Design structure 420 is preferably an input to a design process 410 and may come from an IP provider, a core developer, or other design company or may be generated by the operator of the design flow, or from other sources. Design structure 420 comprises an embodiment of the invention as shown in FIGS. 1A, 1B, and 3 in the form of schematics or HDL, a hardware-description language (e.g., Verilog, VHDL, C, etc.). Design structure 420 may be contained on one or more machine readable medium. For example, design structure 420 may be a text file or a graphical representation of an embodiment of the invention as shown in FIGS. 1A, 1B, and 3. Design process 410 preferably synthesizes (or translates) an embodiment of the invention as shown in FIGS. 1A, 1B, and 3 into a netlist 480, where netlist 480 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 480 is resynthesized one or more times depending on design specifications and parameters for the circuit.

Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 90 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit design can appreciate the extent of possible electronic design automation tools and applications used in design process 410 without deviating from the scope and spirit of the invention. The design structure of the invention is not limited to any specific design flow.

Design process 410 preferably translates an embodiment of the invention as shown in FIGS. 1A, 1B, and 3, along with any additional integrated circuit design or data (if applicable), into a second design structure 490. Design structure 490 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 490 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A, 1B, and 3. Design structure 490 may then proceed to a stage 495 where, for example, design structure 490: proceeds to tape-out, is released to manufacturing, is released to a mask house, is sent to another design house, is sent back to the customer, etc.

More particularly, a dynamic latch design has been presented such that in normal mode, the integrated recovery mechanism portion of the design is isolated from the primary data to latch path. The clock signal must operate at a greater than the capacitance constant of the recovery mechanism portion of latch so that the current state is not lost. If the latch is clock signal gated, then either the hold signal must be pulsed or locked high. Prior to the clock restarting, the hold signal is released. When the supply voltage is off, first the clock signal is gated, and then the hold signal is brought active, followed by the supply voltage being allowed to be turned off. When the supply voltage is turned on after a power down state, first the supply voltage is returned to the circuit, the hold signal is dropped and normal clock operation follows. The clocks must restart within the minimum recovery mechanism capacitance time constant, or the state saved by the integrate recovery mechanism may be lost.

Even more particularly, the invention provides a capacitive or 1 T storage element to store state during power down. The power requirements of hold signal and the routing complexity of the hold signal grid would not exceed that of keeping a secondary latch powered up in most state saving latches. Since the capacitive load of the integrated recovery mechanism only needs to maintain the state, the power requirements of the hold signal should be less than maintaining a powered on second, e.g., shadow latch in other state saving latches.

When a voltage island, as depicted in the schematic of FIG. 3, is powered down, the refresh period for a given voltage island size and latch count will ensure each dynamic state-saving latch of the invention is refreshed within is a specified retention interval, as determined by parameter in the art, for a given junction temperature (Tj) range (e.g., −50 C to 155 C, −25 C to 130 C or 0 C-105 C). The hold signal circuitry and hold signal supply grid is non-interruptible. It consists of hold signal control logic and control signals distributed to the latches. A normal read of the state of the latch will automatically refresh the dynamic latch. The latch control logic with programmable chip-specific parameters will maintain a counter that keeps track of the refresh period to ensure a read by the hold signal control logic occurs from each dynamic latch in the voltage island within the specified retention interval.

Complex read circuitry is also not required as the target for the capacitive storage element would be very limited, e.g., the storage node itself. Because of this, one embodiment for the present invention may be an array static random access memory (SRAM) like array, for example. A hold signal grid may even be implemented efficiently even in a sparse layout of these latches, e.g., flip-flops. Hold signal lines may also be routed much like clock trees. The latch of the present method comprises a hold signal which has just enough voltage to maintain state, but would not support any transitions. The hold signal requires the extra power bus overhead to maintain the state of the latch in the integrated recovery mechanism for the storage element, but does not require any refresh circuitry.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A design structure embodied in a format readable by a computer, stored on a non-transitory machine readable medium for designing, manufacturing, or testing an integrated circuit, the design structure, when executed by the computer providing elements of a dynamic state-saving latch electrical circuit, comprising:
   a charge device;
   an integrated recovery mechanism; and
   a single supply voltage rail connected to said charge device, wherein when said supply voltage rail is active, said charge device maintains a state of said charge device and wherein when said supply voltage rail is inactive, said integrated recovery mechanism maintains a state of said charge device;
   a hold signal generator connected to said integrated recovery mechanism, wherein when said supply voltage rail is inactive, said hold signal generator is adapted to generate a hold signal and to provide said hold signal to said integrated recovery mechanism, wherein said hold signal generator provides said hold signal from one of:
   a voltage domain that does not comprise said latch and is active; and
   an external source not on said voltage domain.

2. The design structure of claim 1, wherein said integrated recovery mechanism holds said state independently of said charge device.

3. The design structure of claim 1, wherein said hold signal uses less power than said voltage rail.

4. The design structure of claim 1, wherein the design structure comprises a netlist.

5. The design structure of claim 1, wherein the design structure resides on storage medium as a data format used for the exchange of layout data of integrated circuits.

6. The design structure of claim 1, all the limitations of which are incorporated herein by reference, wherein the design structure resides in a programmable gate array.

7. A design structure embodied in a format readable by a computer, stored on a non-transitory machine readable medium for designing, manufacturing, or testing an integrated circuit, the design structure, when executed by the computer providing elements of a dynamic state-saving latch electrical circuit, comprising:
   a charge device;
   an integrated recovery mechanism, wherein said integrated recovery mechanism and said charge device are on a first voltage domain;
   a single supply voltage rail connected to said charge device; and
   a hold signal generator connected to said integrated recovery mechanism,
      wherein when said supply voltage rail is active, said charge device maintains a state of said charge device and wherein when said supply voltage rail is inactive, said hold signal generator is adapted to control said integrated recovery mechanism to maintain a state of said charge device, and
      wherein said hold signal is provided from a second voltage domain that does not comprise said latch and is active or wherein said hold signal is provided from an external source not on one of said first voltage domain and said second voltage domain.

8. The design structure of claim 7, wherein when said supply voltage rail is inactive, said hold signal generator is adapted to generate said hold signal.

9. The design structure of claim 7, wherein said hold signal uses less power than said voltage rail.

10. The design structure of claim 7, wherein said integrated recovery mechanism is adapted to maintain said state without the need for additional voltage rails.

11. The design structure of claim 7, wherein the design structure comprises a netlist.

12. The design structure of claim 7, wherein the design structure resides on storage medium as a data format used for the exchange of layout data of integrated circuits.

13. The design structure of claim 7, wherein the design structure resides in a programmable gate array.

* * * * *